United States Patent [19]

Pereyda

[11] Patent Number: 4,855,535
[45] Date of Patent: Aug. 8, 1989

[54] CONTAINER FOR ELECTRICAL APPARATUS

[75] Inventor: Robert Pereyda, San Jose, Calif.
[73] Assignee: Autek Systems Corporation, San Jose, Calif.
[21] Appl. No.: 144,265
[22] Filed: Jan. 15, 1988
[51] Int. Cl.$^4$ .............................................. H05K 5/00
[52] U.S. Cl. .................................... 174/52.1; 361/331
[58] Field of Search .................. 174/50, 52 R, 59, 60, 174/52.1; 361/370, 331, 380, 394, 417, 419

[56] References Cited

U.S. PATENT DOCUMENTS 2,798,781  7/1957  Anderson .......................... 174/52 R
3,052,821  9/1962  Scoville ............................. 174/52 R

*Primary Examiner*—Arthur T. Grimley
*Assistant Examiner*—David A. Tone
*Attorney, Agent, or Firm*—Blakely, Sokoloff, Taylor & Zafman

[57] ABSTRACT

A container for housing electrical apparatus is described. The container has a front panel with affixation means and handles that can be secured for transportation. The front panel can also be opened for access to the internal apparati. The side panels are integrated and reinforced to protect the internal apparati. A connection board is provided to aid in inter connecting the internal apparati. A hinge means is disclosed that allows for self-alignment of the affixation means. Hanger bars are provided for mounting the container on mounting frames. A back panel can also be used during transportation to protect the connection board.

10 Claims, 6 Drawing Sheets

FIG_1
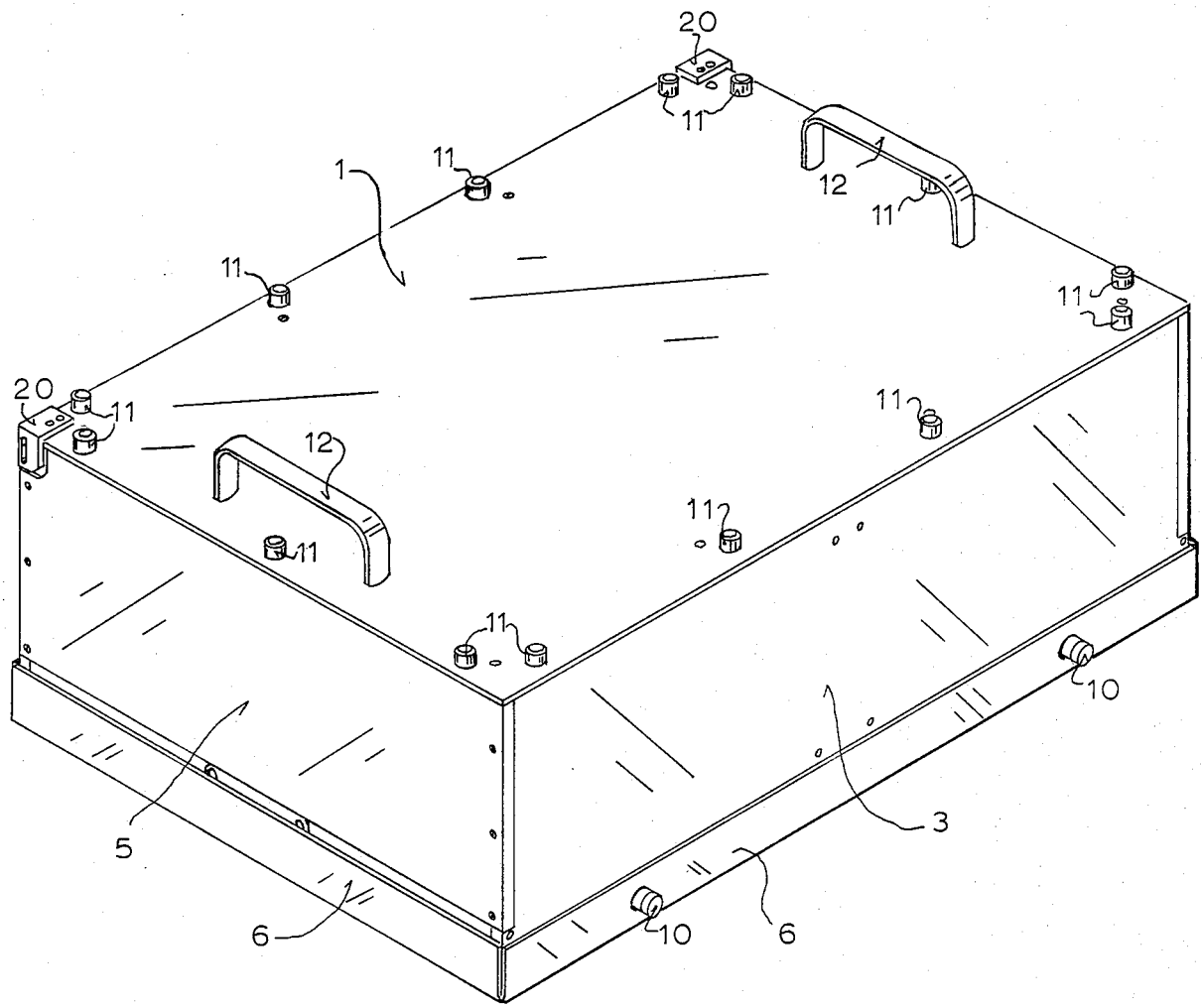

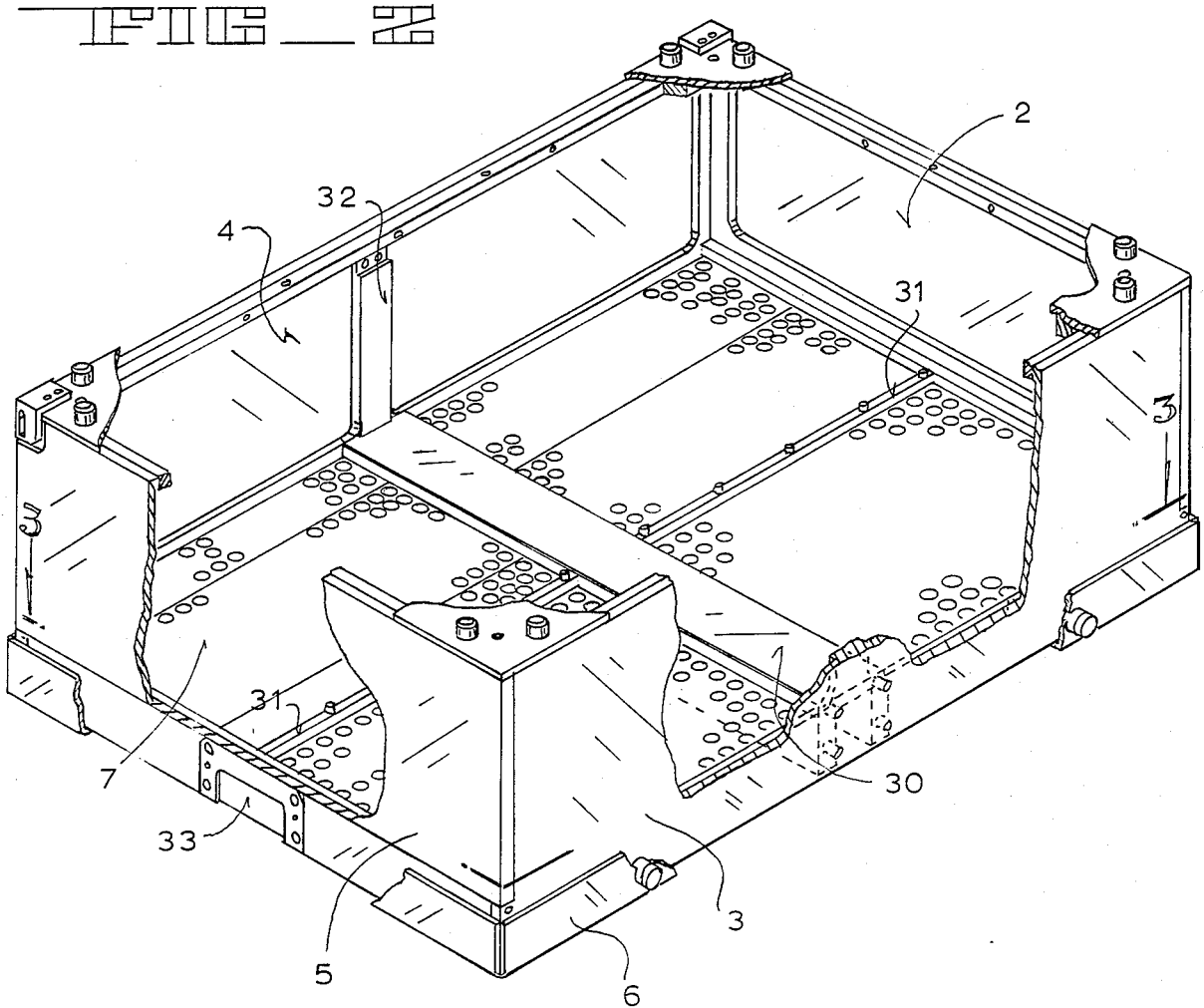

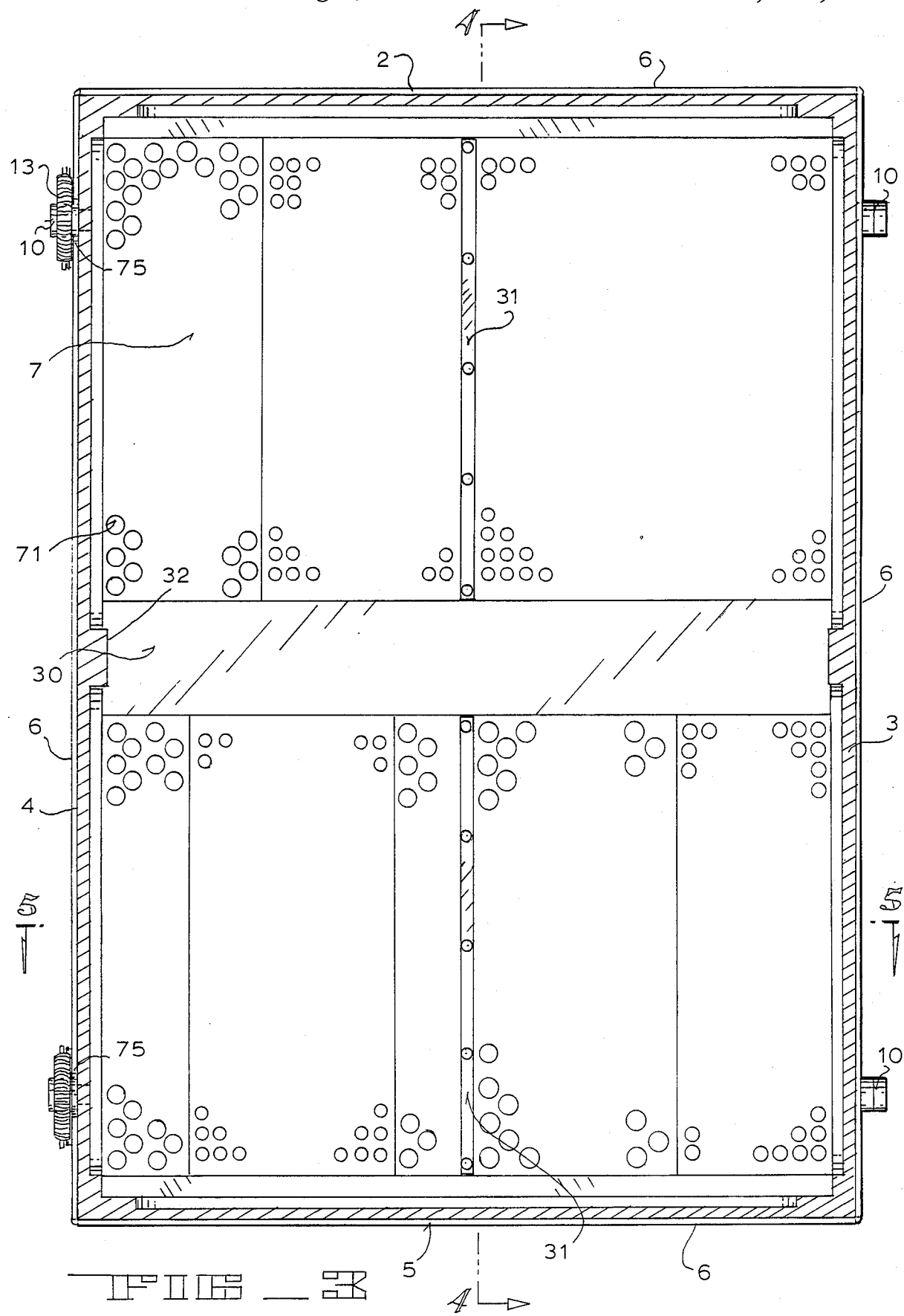
FIG_3

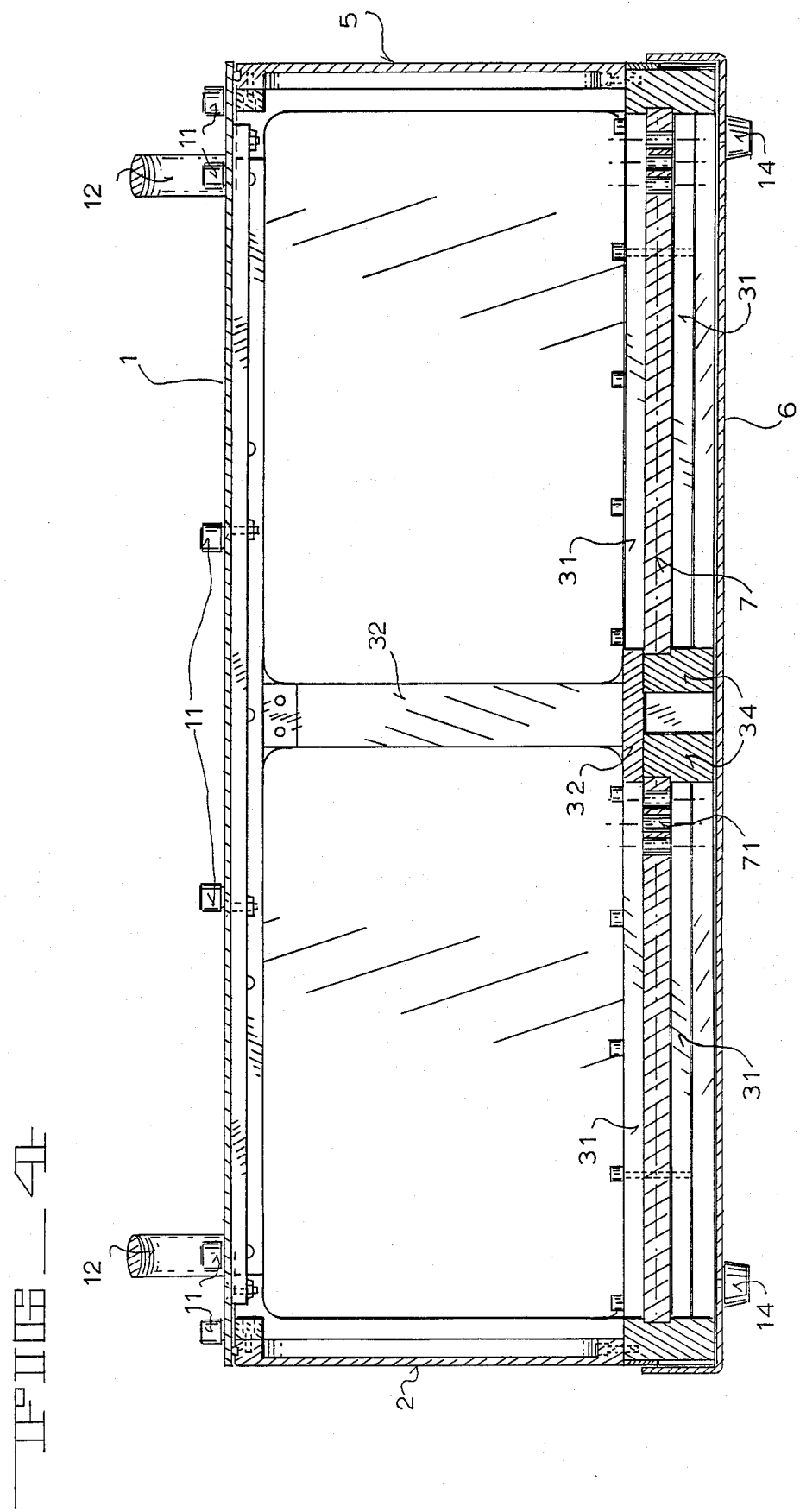

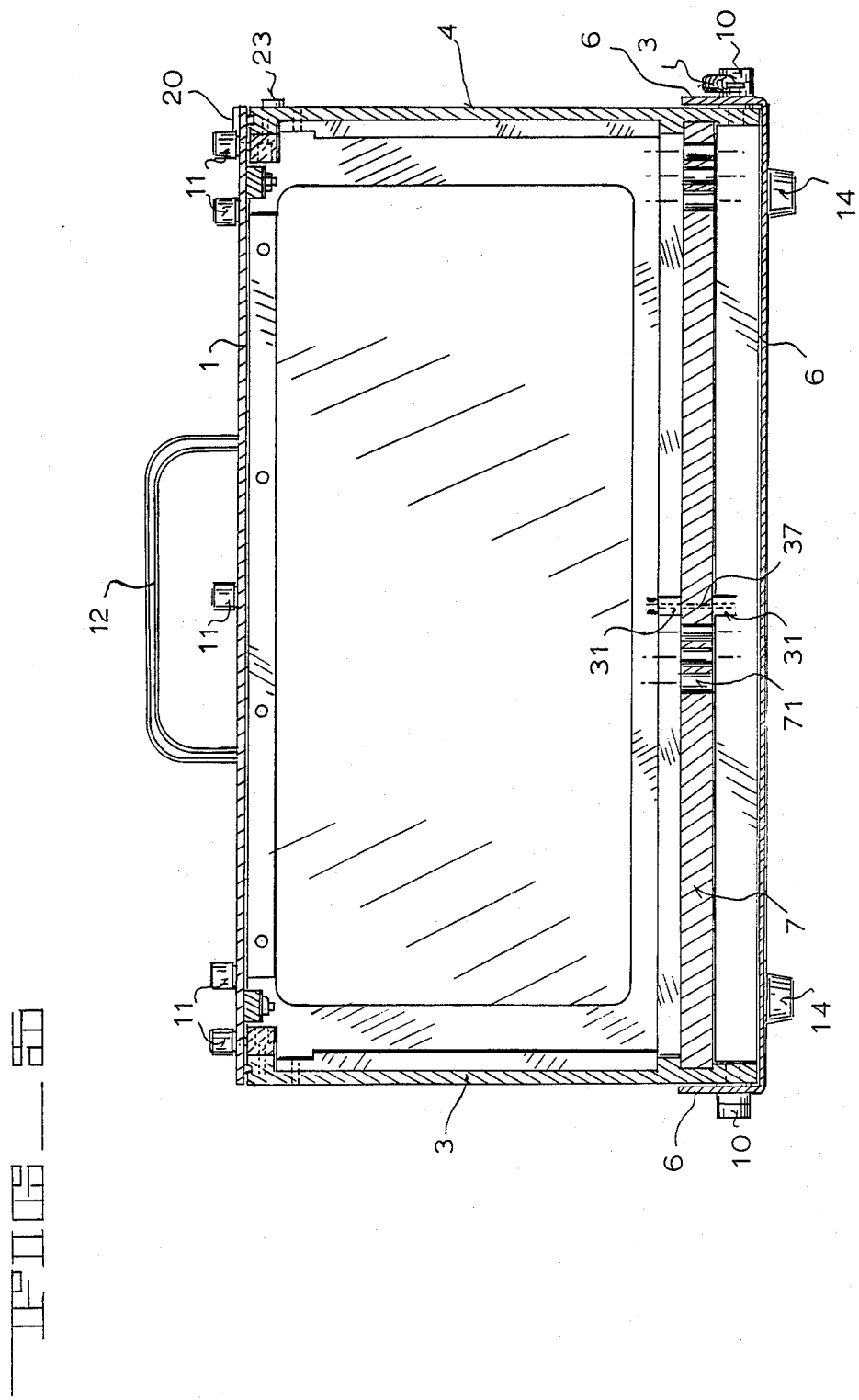

FIG_6
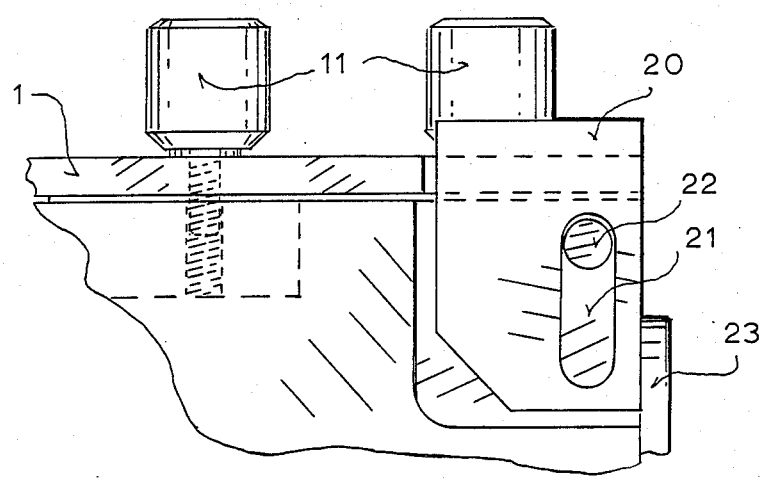
FIG_7
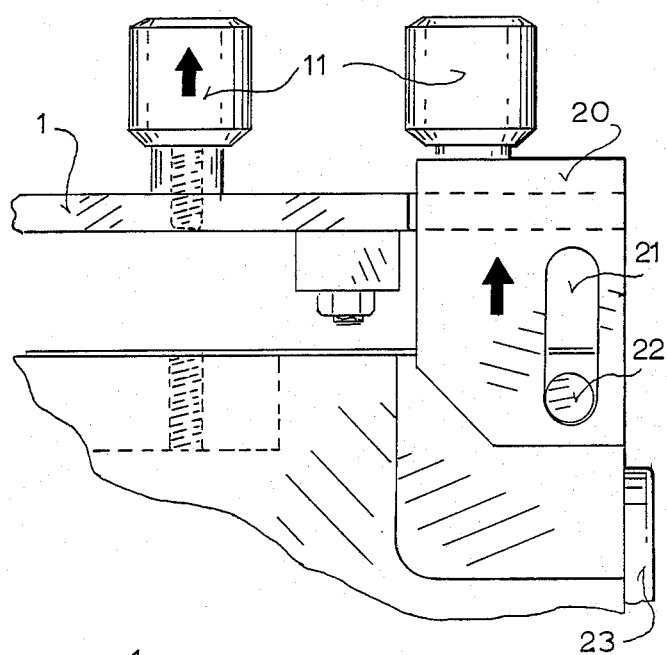
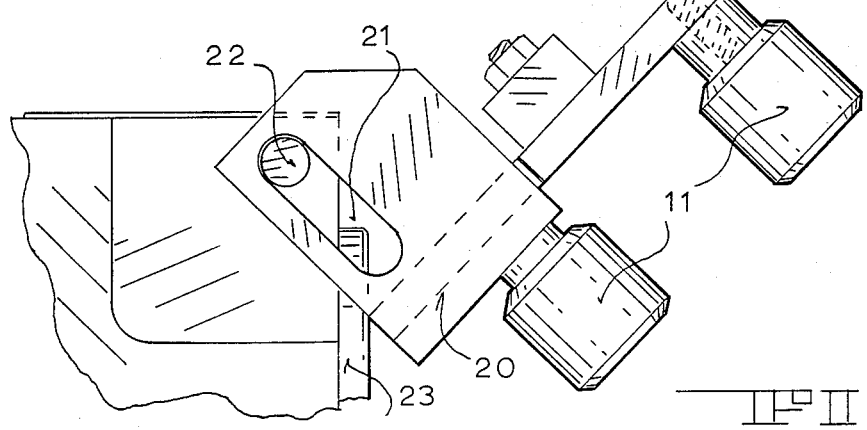
FIG_8

CONTAINER FOR ELECTRICAL APPARATUS

BACKGROUND OF THE INVENTION

1. Field of the Invention

The apparatus of the present invention is related to containers for electrical circuitry. More specifically, the apparatus of the present invention relates to containers for mounting electrical boards and connecting those boards to others in electrical systems.

2. Prior Art

Electronic circuitry is generally fabricated on individual boards with connecting means at the back of the board. Large electronic systems are fabricated by coupling these boards together. Well known in the art are cabinets for physically integrating the various components. Such a device is an interface test adapter. An interface test adapter may house cable wiring, printed circuit boards, connectors, and a host of other electrical apparatus. These devices generally comprise a metal shell with beams along the edges of the rectangular solid formed, but without any sort of panels to protect the boards inside. The shells are mounted on hangers and boards from various devices are coupled through the connection means on the back.

What is needed is a box that provides durability and support as well as transportability while maintaining a flexibility to house a variety of types of electrical circuits. One object of the present invention is to provide a housing for electrical circuit boards that can withstand the stress and wear of heavy industrial and military use. Another object of the invention is to provide for a durable container for electrical boards that can be transported freely without risk of damage of the internal electrical circuits.

SUMMARY OF THE INVENTION

The present invention is an improved container for electrical apparatus. The container comprises a box that has a connection board having holes in which pins may be put through to connect electrical circuitry. The front panel of the box is designed to be both a carrying apparatus for when the circuitry is disconnected from extraneous circuitry and a front panel when the internal circuitry is coupled with external circuitry. The sides of the box are specially reinforced, solid boards which have the ability to withstand much force. A back panel is provided which can be attached over the connection board to protect the connector pins of electrical boards stored in the housing during transportation. Thus, a novel housing for electrical circuit boards is presented.

DESCRIPTION OF THE DRAWINGS

FIG. 1 is a isometric view of the container closed with it back panel on.

FIG. 2 is an internal view of the container taken from the same view point as Figure 1.

FIG. 3 shows the connection board utilized in the container of the present invention.

FIG. 4 is a side view cut away drawing of the container of the present invention taken along line 4—4 in FIG. 3.

FIG. 5 is a side view cut away along line 5—5 in FIG. 3.

FIG. 6 shows the hinge with the front panel in contact with the side panels of the container.

FIG. 7 shows the hinge with the front panel lifted directly above the side panels of the container.

FIG. 8 shows the hinge with the front panel open and swung away from the side panels of the container.

DETAILED DESCRIPTION OF THE INVENTION

The present invention describes a container for electrical apparatus. In the following description, numerous specific details are set forth in order to provide a thorough understanding of the present invention. It will be obvious, however, to one skilled in the art that the present invention may be practiced without these specific details. In other instances, well known methods have not been described in detail so as not to unnecessarily obscure the present invention.

A preferred embodiment of the present invention is shown in FIG. 1. The container is a rectangular in shape having various protrusions for captive thumb screws, handles, hanger bars and hinges.

FIG. 1 shows the container. The container may be carried simply by gripping two carry handles 12 attached to the surface of front panel 1 when front panel 1 is oriented parallel to the plane of the ground. Also located on the surface of the front panel are a plurality of captive thumb screws 11. These screws are well known in the art and have the property that they remain attached to the front panel regardless if the front panel is attached to the sides of the container. There are four captive thumb screws 11 on the right and left edges of the front panel and there are three captive thumb screws 11 on the top and bottom edges of the front panel. On the corners of the left side of the front panel are two sliding hinges 20. When the hinges 20 are in an upright position, the front panel 1 can pivot open and close on the two sliding hinges 20.

The side panels of the container, are bottom side panel 2 and right side panel 3 shown in FIG. 1, and top side panel and left side panel (not shown) are fused with the edges of the container thereby providing no spaces for movement of air or seepage of liquids.

A back panel 6 is shown on the bottom of the container of FIG. 1. Back panel 6 is not physically fused to the rest of the container, but rather slidably fits over the edges of the side panels 2, 3 enclosing the back of the container and is attached to the side panels 2, 3 by hanger bars 10. Furthermore, the hanger bars 10, located on the right side panel in conjunction with a corresponding pair of hanger bars located below the left side panel (not shown), are used to latch the container to standard mounting means on frames for holding containers for electrical apparatus.

The preferred embodiment is primarily constructed of aluminum plates with fiberglass exterior. This forms a hardened plate on the various panels forming the container. Other types of hardened materials can be used within the scope of the invention such as other metals, plastics, or combinations thereof.

The dimensions of the container of the preferred embodiment are as follows. The height, from bottom panel 2 to the top panel (not shown) opposite the bottom panel is approximately 21.24 inches. The width, from right side panel 3 to the opposite left side panel (not shown) is approximately 14.69 inches. The depth, from front panel 1 to the corresponding plane formed by the edges of the side panels, is approximately 7.91 inches.

A typical use for such a container is to have electrical connecting devices attached through front panel 1. A large electrical circuit can be housed in the container and easily transported to the location of circuitry which the electrical devices in the container can couple with in order to test, and or communicates with the circuitry.

FIG. 2 is an isometric cut away view showing the interior of the container. From this view we can see the inside of left side panel 4 as well as top side panel 5. These two panels are also integrated in the design of the container. On left side panel 4 is side support column 32. There is a corresponding side support column on the right side as well. This side support column provides for reinforcement of the side panels. Parallel to the plane of front panel 1 of FIG. 1 is connection board 7 of FIG. 2. Connection board 7 is a board having a plurality of holes. These holes vary in size and shape although they are typically circular and are well known in the art. The holes in connection board 7 are for connector pins of various circuit boards to extend through. The connection board 7 is reinforced by latitudinal support strut 31 which extends from the center of the bottom edge to the center of the top edge of connection board 7. Latitudinal support struts 31 are secured by rods 37. The connection board 7 is further reinforced by longitudinal platform 30 and longitudinal support beams 34. Alignment socket 33 located on bottom side panel 2 aids in orienting connecting board 7 when the container is upright and mounted. There is a corresponding alignment socket located on the top side panel 5 of the container.

FIG. 3 shows a top view of connection board 7. On connection board 7 there are numerous drilled holes of various standard sizes. These holes are designed to allow electrical connections between electrical circuit boards housed in the container and circuitry and peripheral devices outside of the container. Note, longitudinal support platform 30 and latitudinal support strut 31 combine to provide extra reinforcement in addition to the support provided by the exterior edges of bottom side panel 2, top side panel 5, right side panel 3 and left side panel 4. Extending from both right side panel 3 and left side panel 4 are four hanger bars 10. These hanger bars 10 are used to latch the container on a wall mount or other similar device. Furthermore, when the container is being transported, hanger bars 10 serve to attach the back panel over the exterior surface of the connection board. The hanger bars 10 located on the right side of the container are inserted through holes located in the portion of the back panel which is adjacent to the right side panel 3 when the back panel is placed over the rear or back portion of the container where the connection board 7 is located. The hanger bars 10 located on the left side panel of the container are inserted through u-shaped slotted openings 75 located on the portion of the back panel which is adjacent to the left side panel 4 when the back panel is placed over the rear section of the container where the connection board 7 is located. The slotted openings 75 permit the back panel to slide all the way over the left side panel. Coil latch 13 is used to keep the back panel from sliding away from the hanger bars 10 and thus the exterior surface of the connection board by looping the coil latch 13 over the hanger bars 10 located on the left side panel 3. The coil latches 13 are opened by moving them toward the back to the container away from the hanger bars 10 and are closed by lifting them over hanger bars 10 of left side panel 3.

FIG. 4 shows a cut away view along line 4—4 in FIG. 3. On the top is front panel 1. Attached to the top are also four captive thumb screws 11 as well as two carry handles 12. In the middle of this view is side support column 32 which extends from latitudinal support struts 31 to approximately the top edge of left side panels which abuts front panel 1. On the outside surface of back panel 6 are affixed two base supports 14 to provide for cushioning and support when the container is being transported. Also shown is latitudinal support struts 31 and connection board 7. Also shown are rods 37 which couple the top and bottom portions of latitudinal support struts 31 by extending through connection board 7. Connection holes 71 are shown in connection board 7. Connection board 7 comprises two sections; a first section which extends from the edge of top side panel 2 to the top edge of longitudinal support platform 30 and a second section which extends from the bottom edge of longitudinal support platform 30 to the edge of bottom panel 5. Underneath longitudinal support platform 30 are two longitudinal support beams 34. The longitudinal support beams 34 are used to provide the connection board with extra reinforcement necessary because the connection board becomes weakened by the addition of connection holes 71. In order to minimize the problems with a connection board having a large number of connection holes 71, longitudinal support beams 34 are placed so as to reinforce the connection board 7 and extend beyond the connection board to abut the back panel 6. Thus, when the back panel 6 is positioned and attached by hanger bars 10, the back panel 6 shields connection board 7 and any connectors that project through the connection holes 71 and the longitudinal support beams 34 brace back panel 6 so that any tendency for back panel 6 to sag in the middle and abut against connection board 7 or any connector pins that extend through connection holes 71 is eliminated.

FIG. 5 shows a cross sectional view taken along line 5 - 5 in FIG. 3. At the top of the drawing in front panel 1. Attached to the top surface of front panel 1 are three captive thumb screws 11 on the top edge of front panel 1 as well as two other captive thumb screws 11 that reside on the left and right side edges of front panel 1. The right side panel 3 and left side panel 4 are shown. Near the bottom of each side panel are hanger bars 10. This view shows how hanger bars 10 affix back panel 6. The hanger bars 10 that are on the left side panel 4 each fit into one of the holes in back panel 6 thereby holding back panel 6 in position. In addition, each of the hanger bars 10 on the right side panel 3 further hold back panel 6 by inserting the hanger bars 10 into sloted openings located adjacent to right side panel 3 and maintaining that position in those sloted openings by having coil latch 13 put in the close position. Also shown in FIG. 5 is connection board 7 having connection holes 71 as well as latitudinal support strut 31 which abuts connection board 7 on both the top and the bottom and connects these parts of latitudinal support strut 31 by a rod 37.

FIGS. 6, 7 and 8 show various positions of the hinge mechanism 20 used to pivot front panel 1 between an open and close position. FIG. 6 shows the hinge's configuration when the front panel 1 is closed and locked onto the container. Front panel 1 is locked through the use of captive thumb screws 11 which are inserted through front panel 1 and screwed into openings (not shown) located on the side top and bottom panels. The top of hinge 20 is aligned and abuts from panel 1 and, pivot 22 abuts the top of the grooved area 21 when the front panel 1 is closed. When the front panel 1 is opened the pivot 22 is positioned further into the grooved area 21, placing stress on the entire hinging edge and abrading it. This abrasion and stress can be avoided by lifting front panel 1 directly up from the container prior to opening front panel 1.

This is shown in FIG. 7. The front panel 1 is said to be "floating" in this position. Because of this ability to float, the front panel 1 is able to align the captive thumb screws 11 with the holes the screws lock in to the side panels. Captive thumb screws 11 have been unscrewed so as to decouple front panel 1 from the rest of the container. This allows for pivot 22 to be glided through wooded area 21 as shown in FIG. 7. FIG. 7 also shows bumper knob 23 which is used to protect the side panel of the container from the front panel of the container when it swings out.

FIG. 8 shown front panel 1 swinging on pivot 22 to an open position. Pivot 22 has now assumed position at the bottom of groove 21. From this position the front panel 1 may be swung out further than it could in a conventional hinge design. In addition the design maintains the alignment of front panel 1 with respect to the side panels of the container so that captive thumb screws 11 are always properly aligned and can be screwed into the openings located on the side top and bottom panels to allow for transportation of the container.

The hinge 20 is fabricated from stainless steel in the preferred embodiment. However, any durable material such as steel, iron, plastic and the like can be used and still be within the scope of the present invention.

The first hinge 20 extends and attaches to front panel 1 and top panel two. The second hinge 20 extends and attaches to front panel 1 and bottom panel 5. In the preferred embodiment, both hinges 20 are a metal object of thickness of approximately 0.187 inches. The portion of the hinge 20 which attaches to front panel 1 are approximately 1.15 inches long and the portion which attaches to either the top panel 2 and bottom panel 5 are approximately 1 inch in length. On the front panel 1 the hinges are secured by two screws (not shown) which attach to left side panel 4. The hinges have a rounded rectangular groove 21 which allows the pivot 22 to slide from the top of the groove 21, as it is positioned in FIG. 6, to the bottom of the groove 21, as it is positioned in FIGS. 7 and 8. In the preferred embodiment, the groove 21 extends approximately 0.38 inches from the front panel edge to the bottom which is approximately 0.9 inches from the front panel edge. This allows for raising the front panel 1 approximately 0.325 inches from the side panels without pivoting the front panel 1.

Thus, an improved container for electrical apparatus has been described in the foregoing description.

We claim:

1. A container for housing an electrical apparatus comprising:
    a plurality of panels coupled together to form the top, bottom, left and right side panels of the container, said side panels comprising means for periodic reinforcement of the panels;
    a front panel forming the front of the container comprising means to attach the front panel to said side panels and means to carry the container;
    hinge means which pivotably couples the front panel to the side panels such that the front panel pivots between an open and closed position, said hinge comprising a linear groove means to allow for the upward movement of said front panel before pivoting said front panel to an open position;
    a connection board attached to the rear of the container comprising a plurality of holes to connect the electrical apparatus to be housed in the container whereby external peripheral devices may be connected to the electrical apparatus when housed in the container through the holes; and
    hanger bar means attached to the side panels for mounting the container on a mounting frame.

2. A container as described in claim 1 further comprising:
    a longitudinal support platform positioned across the center of the connection board effectively dividing the connection board into two half sections thereby providing support to the connection board;
    longitudinal support beams located underneath the longitudinal support platform and extending beyond the connection board to abut a back panel thereby preventing the back panel from coming into physical contact with the connection board; and
    latitudinal support struts located on the exterior and interior sides of the connection board to further support the connection board, said latitudinal support struts connected by rods oriented perpendicular to the
    structs and extending through the connection board, whereby the connection board is reinforced and supported.

3. The container as described in claim 1 further comprising a back panel coupled to said hanger bar means for attaching the back panel to the back of said container whereby said connection board and any electrical apparatus coupled through said connection board are protected.

4. The container as described in claim 3 wherein said back panel comprises holes and slots through which said hanger bar means are inserted and a latching means coupled across each of said slots for allowing or blocking passage of the hanger bar means through said slot whereby said hanger bar means extend through said holes and slides into the slots and is latched by said latching means.

5. A container such as described in claim 4 where said means to attach the front panel are captive thumb screws.

6. A container such as described in claim 5 where said hinge means and said front panel are coupled such that said front panel has a float whereby said captive thumb screws are properly aligned.

7. A container as described in claim 5 further comprising a bumper means coupled to one of said side panels for protecting said hinge means and said one side panel from colliding with said front panel.

8. A container as described in claim 7 where said hinge means and said front panel are coupled such that said front panel has a float whereby said captive thumb screws are properly aligned.

9. A container as described in claim 8 wherein said hinge means allows for raising said front panel aproximately 0.325 inches without pivoting said front panel.

10. A container as described in claim 9 which has the dimensions comprising of height, the distance from said top panel and said bottom panel, of approximately 21.24 inches, a width, the distance between said side panels, of approximately 14.69 inches, and a depth, the distance from the front panel to the plane formed by the edges of said top, said bottom, and said side panels which are closer to said connector board, of approximately 7.91 inches.

* * * * *

UNITED STATES PATENT AND TRADEMARK OFFICE
CERTIFICATE OF CORRECTION

PATENT NO. : 4,855,535

DATED : 08/08/89

INVENTOR(S) : Pereyda

It is certified that error in the above-identified patent and that said Letters Patent is hereby corrected as shown below:

col. 05, line 14    delete "wooded" insert --grooved--
    col. 06, line 26    delete "structs" insert --struts--

Signed and Sealed this

Thirteenth Day of November, 1990

*Attest:*

HARRY F. MANBECK, JR.

*Attesting Officer*    *Commissioner of Patents and Trademarks*